(12) United States Patent
Hu et al.

(10) Patent No.: US 11,340,737 B2
(45) Date of Patent: May 24, 2022

(54) TOUCH STRUCTURE AND METHOD FOR MANUFACTURING THE SAME, TOUCH SUBSTRATE, DISPLAY SUBSTRATE

(71) Applicants: BEIJING BOE DISPLAY TECHNOLOGY CO., LTD., Beijing (CN); BOE TECHNOLOGY GROUP CO., LTD., Beijing (CN)

(72) Inventors: Weipin Hu, Beijing (CN); Congcong Wei, Beijing (CN); Chun Wang, Beijing (CN); Mingxiao Jiang, Beijing (CN); Xiao Sun, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 533 days.

(21) Appl. No.: 16/336,387

(22) PCT Filed: Nov. 21, 2018

(86) PCT No.: PCT/CN2018/116739
§ 371 (c)(1),
(2) Date: Mar. 25, 2019

(87) PCT Pub. No.: WO2019/134458
PCT Pub. Date: Jul. 11, 2019

(65) Prior Publication Data
US 2021/0325985 A1    Oct. 21, 2021

(30) Foreign Application Priority Data
Jan. 2, 2018    (CN) .......................... 201810002250.7

(51) Int. Cl.
*G06F 3/044*     (2006.01)
*G06F 3/041*     (2006.01)
*H01L 27/12*     (2006.01)

(52) U.S. Cl.
CPC ............ *G06F 3/044* (2013.01); *G06F 3/0412* (2013.01); *H01L 27/1255* (2013.01); *G06F 2203/04103* (2013.01)

(58) Field of Classification Search
CPC ................... G06F 3/044; G06F 3/0412; G06F 2203/04103; H01L 27/1255
See application file for complete search history.

(56) References Cited

U.S. PATENT DOCUMENTS 9,740,344 B2    8/2017    Huang et al.
2015/0378390 A1*   12/2015    Liu .................. G06F 3/0443
                                                345/173

(Continued)

FOREIGN PATENT DOCUMENTS

CN    103472951 A    12/2013
CN    104049821 A    9/2014

(Continued)

OTHER PUBLICATIONS

First Office Action dated Apr. 15, 2020 for corresponding Chinese application 201810002250.7.

(Continued)

*Primary Examiner* — Peter D McLoone
(74) *Attorney, Agent, or Firm* — Nath, Goldberg & Meyer; Joshua B. Goldberg

(57) ABSTRACT

The present disclosure provides a touch structure and a method for manufacturing the touch structure, a touch substrate and a display substrate. The touch structure includes: a touch electrode; a first signal line and an auxiliary conductive structure provided at a side of the touch (Continued)

electrode, the auxiliary conductive structure has a conductivity greater than that of the touch electrode; and a first insulation layer provided between the auxiliary conductive structure and the first signal line, the auxiliary conductive structure is coupled to the touch electrode at multiple coupling positions and is coupled to the first signal line through a first via-hole penetrating through the first insulation layer.

17 Claims, 3 Drawing Sheets

(56) References Cited

U.S. PATENT DOCUMENTS

| | | | |
|---|---|---|---|
| 2016/0216802 A1 | 7/2016 | Bao et al. | |
| 2016/0274716 A1 | 9/2016 | Liu et al. | |
| 2016/0370944 A1* | 12/2016 | Zhao | G06F 3/0443 |
| 2017/0083139 A1 | 3/2017 | Kim et al. | |

FOREIGN PATENT DOCUMENTS

| | | | |
|---|---|---|---|
| CN | 105759483 A | 7/2016 |
| CN | 106681044 A | 5/2017 |
| CN | 106909249 A | 6/2017 |
| JP | 2015122392 A | 7/2015 |

OTHER PUBLICATIONS

Search Report dated Sep. 2, 2021 issued in European Application No. 18855187.3.

\* cited by examiner

TOUCH STRUCTURE AND METHOD FOR MANUFACTURING THE SAME, TOUCH SUBSTRATE, DISPLAY SUBSTRATE

CROSS-REFERENCE TO RELATED APPLICATIONS

This is a National Phase Application filed under 35 U.S.C. 371 as a national stage of PCT/CN2018/116739, filed Nov. 21, 2018, an application claiming the benefit of Chinese Application No. 201810002250.7, filed Jan. 2, 2018, the contents of each of which are incorporated herein in their entirety by reference.

TECHNICAL FIELD

The present disclosure relates to, but is not limited to, the field of touch technology, and in particular, to a touch structure and a method for manufacturing the touch structure, a touch substrate and a display substrate.

BACKGROUND

Conventionally, a touch structure includes a touch electrode, an insulation layer and a signal line, the signal line may be coupled to the touch electrode through a via-hole in the insulation layer to transmit a signal to the touch electrode, and then the signal is transmitted in the touch electrode. However, the touch electrode is generally formed of transparent conductive material such as indium tin oxide (ITO), has a relatively large resistance, thus a relatively large time delay and attenuation would be generated when the signal is transmitted in the touch electrode, resulting in non-uniform signal transmitted in the touch electrode, affecting a touch effect.

SUMMARY

An embodiment of the present disclosure provides a touch structure, including: a touch electrode; a first signal line and an auxiliary conductive structure provided at a side of the touch electrode, the auxiliary conductive structure has a conductivity greater than that of the touch electrode; and a first insulation layer provided between the auxiliary conductive structure and the first signal line, the auxiliary conductive structure is coupled to the touch electrode at multiple coupling positions and is coupled to the first signal line through a first via-hole penetrating through the first insulation layer.

In some implementations, the auxiliary conductive structure is coupled to the first signal line at multiple coupling positions through multiple first via-holes penetrating through the first insulation layer respectively.

In some implementations, an orthographic projection of at least one of the multiple coupling positions between the auxiliary conductive structure and the touch electrode on the touch electrode does not overlap an orthographic projection of the first signal line on the touch electrode.

In some implementations, the touch structure further includes: a second signal line provided in a same layer as the first signal line, the first signal line and the second signal line are provided in parallel, and the second signal line is not coupled to the touch electrode, an orthographic projection of at least one of the multiple coupling positions between the auxiliary conductive structure and the touch electrode on the touch electrode is at a side of an orthographic projection of the second signal line on the touch electrode away from an orthographic projection of the first signal line on the touch electrode.

In some implementations, the auxiliary conductive structure is of a net-like structure.

In some implementations, a layer where the auxiliary conductive structure is located is between a layer where the first signal line is located and a layer where the touch electrode is located.

In some implementations, the auxiliary conductive structure directly contacts the touch electrode.

In some implementations, a second insulation layer is provided between the auxiliary conductive structure and the touch electrode, the auxiliary conductive structure is coupled to the touch electrode at multiple coupling positions through multiple second via-holes penetrating through the second insulation layer.

In some implementations, a layer where the first signal line is located is between a layer where the auxiliary conductive structure is located and a layer where the touch electrode is located, a third insulation layer is provided between the first signal line and the touch electrode, the auxiliary conductive structure is coupled to the touch electrode at multiple coupling positions through multiple third via-holes penetrating through the first insulation layer and the third insulation layer, and a position of the first signal line does not overlap positions of the third via-holes.

An embodiment of the present disclosure further provides a touch substrate, including: a base substrate; a plurality of touch structures provided at intervals on the base substrate, the touch structures are arranged in an array, and at least one of the touch structures is the touch structure in the embodiment of the present disclosure.

An embodiment of the present disclosure further provides a display substrate, including pixel elements provided at intervals and touch structures provided at intervals, at least one of the touch structures covers multiple adjacent pixel elements, at least one of the touch structures is the touch structure in the embodiment of the present disclosure, and the first signal line and the auxiliary conductive structure of the at least one of the touch structures are provided in an interval between adjacent pixel elements.

In some implementations, the display substrate further includes a gate line and a data line, the auxiliary conductive structure and the gate line are provided in different layers, the auxiliary conductive structure and the data line are provided in different layers, at least one insulation layer is provided between the auxiliary conductive structure and the gate line, and at least one insulation layer is provided between the auxiliary conductive structure and the data line.

In some implementations, the first signal line and the data line are provided in a same layer and in parallel.

In some implementations, the auxiliary conductive structure includes a first part parallel to the gate line and a second part parallel to the data line, an orthographic projection of the first part of the auxiliary conductive structure on the touch electrode overlaps an orthographic projection of the gate line on the touch electrode, and orthographic projection of the second part of the auxiliary conductive structure on the touch electrode overlaps an orthographic projection of the first signal line on the touch electrode.

In some implementations, the touch electrode is multiplexed as a common electrode.

An embodiment of the present disclosure further provides a method for manufacturing a touch structure, including: forming a first signal line and an auxiliary conductive structure on a base substrate, a first insulation layer is formed between the auxiliary conductive structure and the first signal line; and forming a touch electrode on the base substrate formed with the first signal line and the auxiliary conductive structure, the auxiliary conductive structure has a conductivity greater than that of the touch electrode, the auxiliary conductive structure is formed to be coupled to the touch electrode at multiple coupling positions, and coupled to the first signal line through a first via-hole formed in the first insulation layer.

In some implementations, the auxiliary conductive structure is formed to be coupled to the first signal line at multiple coupling positions through multiple first via-holes formed in the first insulation layer respectively.

In some implementations, the auxiliary conductive structure and the touch electrode are formed so that an orthographic projection of at least one of the multiple coupling positions between the auxiliary conductive structure and the touch electrode on the touch electrode does not overlap an orthographic projection of the first signal line on the touch electrode.

In some implementations, the method further includes: forming a second signal line in a same layer as the first signal line, the first signal line and the second signal line are in parallel, and the second signal line is not coupled to the touch electrode, the auxiliary conductive structure and the touch electrode are formed so that an orthographic projection of at least one of the multiple coupling positions between the auxiliary conductive structure and the touch electrode on the touch electrode is at a side of an orthographic projection of the second signal line on the touch electrode away from an orthographic projection of the first signal line on the touch electrode.

In some implementations, the auxiliary conductive structure is formed to be of a net-like structure.

In some implementations, forming the first signal line and the auxiliary conductive structure on the base substrate includes: forming the first signal line on the base substrate; forming the first insulation layer above the first signal line; and forming the auxiliary conductive layer on the first insulation layer.

In some implementations, forming the touch electrode on the base substrate formed with the first signal line and the auxiliary conductive structure includes: forming the touch electrode directly on the auxiliary conductive structure so that the auxiliary conductive structure directly contacts the touch electrode.

In some implementations, forming the touch electrode on the base substrate formed with the first signal line and the auxiliary conductive structure includes: forming a second insulation layer above the auxiliary conductive structure; and forming the touch electrode on the second insulation layer, and the auxiliary conductive structure is coupled to the touch electrode at multiple coupling positions through multiple second via-holes formed in the second insulation layer.

In some implementations, forming the first signal line and the auxiliary conductive structure on the base substrate includes: forming the auxiliary conductive structure on the base substrate; forming the first insulation layer above the auxiliary conductive structure; forming the first signal line on the first insulation layer; and forming a third insulation layer above the first signal line. Correspondingly, forming the touch electrode on the base substrate formed with the first signal line and the auxiliary conductive structure includes: forming the touch electrode on the third insulation layer, the auxiliary conductive structure is formed to be coupled to the touch electrode at multiple coupling positions through multiple third via-holes formed in the first insulation layer and the third insulation layer, and a position of the first signal line does not overlap positions of the third via-holes.

DESCRIPTION OF EMBODIMENTS

Figure 1:
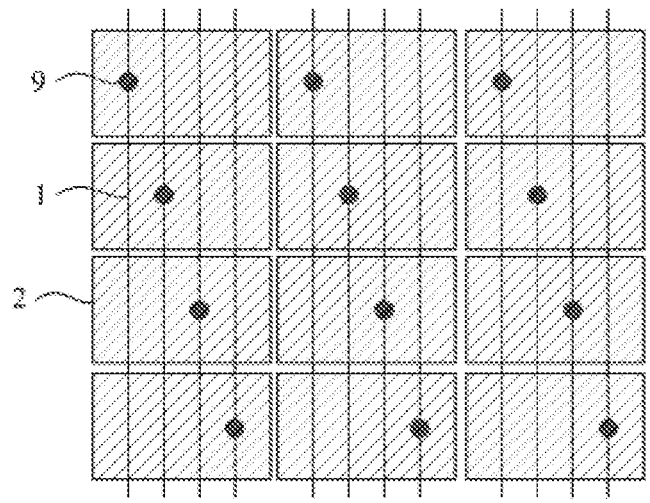
FIG. 1 shows a structural diagram of a touch substrate.

In order to make a person skilled in the art understand technical solutions of the present disclosure better, the present disclosure will be described in detail below in conjunction with accompanying drawings and specific embodiments.

In the present disclosure, two structures being provided "in a same layer" means that the two structures are formed from a same material layer, thus the two structures are in a same layer in stacking relationship, which does not mean that distances from the two structures to a base substrate are the same with each other.

In the present disclosure, "first" and "second" defined before any terms are only used for distinguishing entities represented by the terms, but not for representing sequences, importances or the like of the entities represented by the terms, and in a case where there is no need to distinguish the entities from each other, the definitions of "first" and "second" may be omitted.

In the present disclosure, "patterning process" refers to steps for forming a structure with a particular pattern, may be a photolithographic process including one or more of steps such as forming a material layer, coating photoresist, exposing, developing, etching, stripping off the photoresist and so on. Certainly, the "patterning process" may also be any other process such as imprinting process, inkjet printing process and so on.

An embodiment of the present disclosure provides a touch structure, including: a touch electrode; a first signal line and an auxiliary conductive structure provided at a side of the touch electrode, the auxiliary conductive structure has a conductivity greater than that of the touch electrode; and a first insulation layer provided between the auxiliary conductive structure and the first signal line, the auxiliary conductive structure is coupled to the touch electrode at multiple coupling positions and is coupled to the first signal line through a first via-hole penetrating through the first insulation layer.

In the touch structure of the embodiment, the first signal line is electrically coupled to the touch electrode indirectly through the auxiliary conductive structure, the auxiliary conductive structure has a conductivity greater than that of the touch electrode, for example, the auxiliary conductive structure may be formed of metal, thus has a relatively low resistance and a strong ability to transmit a signal, and since the auxiliary conductive structure may be coupled to the touch electrode at multiple coupling positions, a signal in the first signal line may be smoothly transmitted to multiple positions of the touch electrode, eliminating or reducing an occurrence of non-uniform signal in the touch electrode, resulting an improved touch effect.

In some implementations, the auxiliary conductive structure is coupled to the first signal line at multiple coupling positions through multiple first via-holes penetrating through the first insulation layer respectively.

By coupling the auxiliary conductive structure to the first signal line at multiple coupling positions, a resistance between the auxiliary conductive structure and the first signal line may be reduced, further eliminating or reducing the occurrence of non-uniform signal in the touch electrode, resulting in a further improved touch effect.

In some implementations, an orthographic projection of at least one of the multiple coupling positions between the auxiliary conductive structure and the touch electrode on the touch electrode does not overlap an orthographic projection of the first signal line on the touch electrode.

That is to say, the auxiliary conductive structure may be coupled to the touch electrode at a position beyond a range where the first signal line is located, so as to transmit a signal to the position of the touch electrode at which the first signal line cannot directly reach, thereby improving uniformity of signal in the touch electrode.

In some implementations, the touch structure further includes: a second signal line provided in a same layer as the first signal line, the first signal line and the second signal line are provided in parallel, and the second signal line is not coupled to the touch electrode, an orthographic projection of at least one of the multiple coupling positions between the auxiliary conductive structure and the touch electrode on the touch electrode is at a side of an orthographic projection of the second signal line on the touch electrode away from an orthographic projection of the first signal line on the touch electrode.

It should be understood that, in a case where the first signal line and the second signal line are provided in a same layer, the first signal line cannot intersect with the second signal line (if the first signal line intersects with the second signal line, the first signal line and the second signal line would communicate with each other), that is, the first signal line cannot cross the second signal line to transmit a signal to a position farther from the first signal line than the second signal line, however, the touch structure of the embodiment employs the auxiliary conductive structure, the first insulation layer is provided between the auxiliary conductive structure and the first and second signal lines, thus the auxiliary conductive structure can be coupled to the touch electrode at the position farther from the first signal line than the second signal line to transmit the signal to the touch electrode, which improves uniformity of signal in the touch electrode.

In some implementations, the auxiliary conductive structure is of a net-like structure.

In the touch structure of the embodiment, by providing the auxiliary conductive structure as a net-like structure, in an aspect, a resistance of the auxiliary conductive structure may be reduced, and in another aspect, the auxiliary conductive structure may be coupled to the touch electrode at multiple coupling positions to transmit a signal to multiple positions of the touch electrode, improving uniformity of signal in the touch electrode.

It should be understood that, the auxiliary conductive structure may also be of any other form.

In some implementations, a layer where the auxiliary conductive structure is located is between a layer where the first signal line is located and a layer where the touch electrode is located.

It should be understood that, the layer where the auxiliary conductive structure is located being between the layer where the first signal line is located and the layer where the touch electrode is located facilitates the auxiliary conductive structure to be coupled to the first signal line and the touch electrode simultaneously.

In some implementations, the auxiliary conductive structure directly contacts the touch electrode.

In some implementations, a second insulation layer is provided between the auxiliary conductive structure and the touch electrode, the auxiliary conductive structure is coupled to the touch electrode at multiple coupling positions through multiple second via-holes penetrating through the second insulation layer.

In some implementations, a layer where the first signal line is located is between a layer where the auxiliary conductive structure is located and a layer where the touch electrode is located, a third insulation layer is provided between the first signal line and the touch electrode, the auxiliary conductive structure is coupled to the touch electrode at multiple coupling positions through multiple third via-holes penetrating through the first insulation layer and the third insulation layer, and a position of the first signal line does not overlap positions of the third via-holes.

That is to say, in a case where the layer where the first signal line is located is between the layer where the auxiliary conductive structure is located and the layer where the touch electrode is located, the auxiliary conductive structure may be coupled to the touch electrode at a position where there is no the first signal line.

FIG. 1 shows a structural diagram of a touch substrate.

As shown in FIG. 1, the touch substrate includes a plurality of touch electrodes 2 arranged at intervals on a base substrate, the touch electrodes 2 are arranged in an array, each of the touch electrodes 2 is correspondingly coupled to one signal line 1, the signal line 1 can transmit a signal to the touch electrode 2, and then the signal is transmitted in the touch electrode 2. For example, an insulation layer is provided between the touch electrode 2 and the signal line 1, and the touch electrode 2 is coupled to the signal line 1 through a via-hole 9 penetrating through the insulation layer.

Generally, the touch electrode 2 is formed of transparent conductive material such as indium tin oxide (ITO), has a relatively large resistance, thus a relatively large time delay and attenuation would be generated when the signal is transmitted in the touch electrode 2, resulting in non-uniform signal transmitted in the touch electrode 2, affecting a touch effect.

An embodiment of the present disclosure provides a touch substrate, including: a base substrate; a plurality of touch structures arranged at intervals on the base substrate, the touch structures are arranged in an array, and at least one of the touch structures is the touch structure in the embodiment of the present disclosure.

An embodiment of the present disclosure further provides a display substrate, including pixel elements provided at intervals and touch structures provided at intervals, at least one of the touch structures covers multiple adjacent pixel elements, at least one of the touch structures is the touch structure in the embodiment of the present disclosure, and the first signal line and the auxiliary conductive structure of the at least one of the touch structures are provided in an interval between adjacent pixel elements.

FIGS. 2 through 6 show diagrams of the touch substrate, the touch structure and the display substrate in embodiments of the present disclosure.

As shown in FIGS. 2 through 5, the touch substrate of the embodiment includes: a base substrate 8; a plurality of touch electrodes 2, formed of transparent conductive material, arranged at intervals on the base substrate 8, the touch electrodes 2 are arranged in an array; a plurality of signal lines 1 coupled to the touch electrodes 2 in one-to-one correspondence, and at least one insulation layer is provided between the signal lines 1 and the touch electrodes 2.

The touch substrate of the embodiment is configured to realize a touch control function, that is, to identify a touch. In the touch substrate, the touch electrodes 2 formed of transparent conductive material such as indium tin oxide (ITO) are arranged at intervals, and each of the touch electrodes 2 is coupled to one of the signal lines 1. Thus, a touch signal (e.g., a high frequency signal) may be transmitted to a corresponding touch electrode 2 through a corresponding signal line 1. When a touch occurs, the signal in the touch electrode 2 at a position where the touch occurs changes, the corresponding signal line 1 feeds such signal to, for example, a touch control chip, the touch control chip analyzes it and determines, for example, the position where the touch occurs, thereby an appropriate response may be made with respect to the touch.

In the touch substrate of the embodiment, an auxiliary conductive structure 3 is provided corresponding to at least one of the touch electrodes 2, and the auxiliary conductive structure 3 is coupled to the touch electrode 2 corresponding thereto at multiple coupling positions. The corresponding signal line 1 and the auxiliary conductive structure 3 are provided at a same side of the touch electrode 2, and a first insulation layer 71 is provided between the auxiliary conductive structure 3 and the corresponding signal line 1. The auxiliary conductive structure 3 may be coupled to the corresponding signal line 1 through a first via-hole 91 penetrating through the first insulation layer 71.

Figure 2:
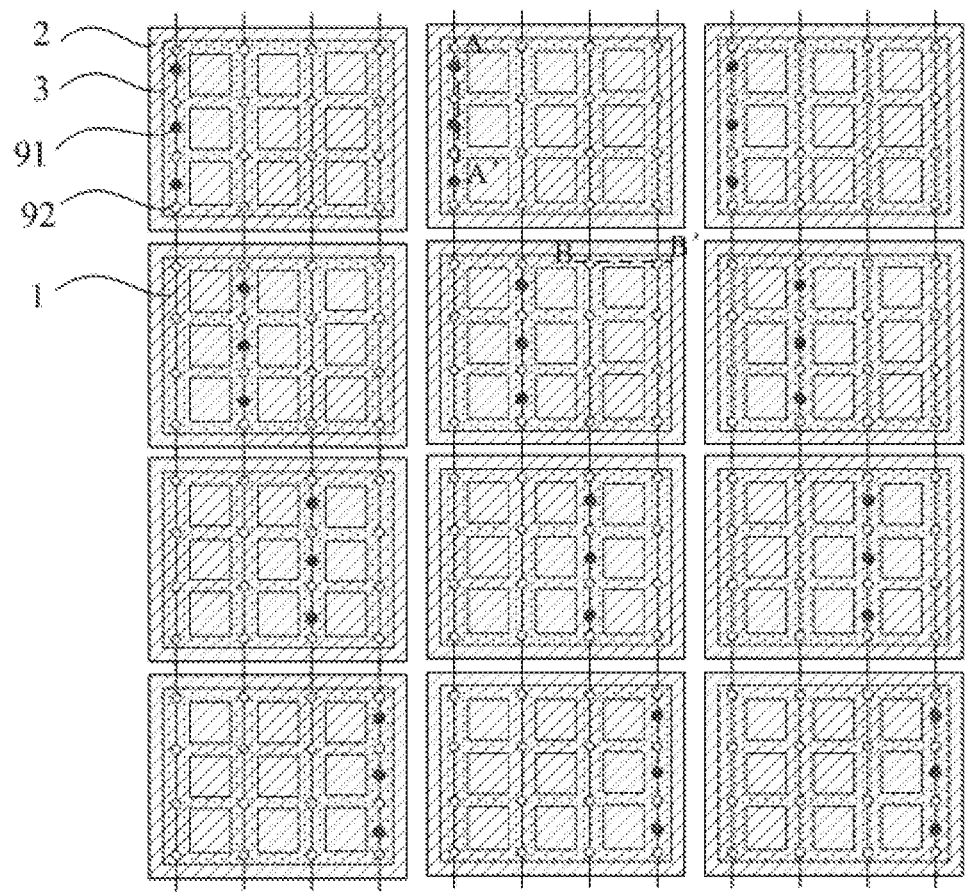
FIG. 2 shows a structural diagram of a touch substrate in an embodiment of the present disclosure.

That is to say, as shown in FIG. 2, in the touch substrate of the embodiment, the auxiliary conductive structure 3, which may be formed of metal material such as aluminum and copper commonly used for lead wires, is provided corresponding to at least one of the touch electrodes 2, thus the auxiliary conductive structure 3 is also in correspondence to the signal line 1 coupled to the corresponding touch electrode 2. Therefore, the signal line 1 is not directly coupled to the corresponding touch electrode 2, but is coupled to the corresponding auxiliary conductive structure 3 through the first via-hole 91 penetrating through the first insulation layer 71, and then the auxiliary conductive structure 3 is further coupled to the corresponding touch electrode 2 at multiple coupling positions.

In the touch substrate of the embodiment, the signal line 1 is electrically coupled to the touch electrode 2 indirectly through the auxiliary conductive structure 3, and the auxiliary conductive structure 3 has a conductivity greater than that of the touch electrode 2, for example, the auxiliary conductive structure 3 may be formed of metal, thus has a relative small resistance and a strong ability to transmit a signal, and since the auxiliary conductive structure 3 is coupled to the touch electrode 2 at multiple coupling positions, a signal in the signal line 1 can be transmitted to multiple positions of the touch electrode 2 smoothly through the auxiliary conductive structure 3, eliminating or reducing an occurrence of non-uniform signal in the touch electrode 2, resulting an improved touch effect.

It should be understood that, the auxiliary conductive structure 3 can improve uniformity of signal in the touch electrode 2 corresponding thereto, thus, in order to achieve a better improvement effect, each of the touch electrodes 2 may be provided with a corresponding auxiliary conductive structure 3 to be coupled thereto. Certainly, it is feasible to provide auxiliary conductive structures 3 corresponding to only a portion of the touch electrodes 2 respectively, while the remaining of the touch electrodes 2 may also be coupled to corresponding signal lines 1 directly.

In some implementations, each auxiliary conductive structure 3 may be coupled to the corresponding signal line 1 at multiple coupling positions through multiple first via-holes 91 penetrating through the first insulation layer 71.

Figure 3:
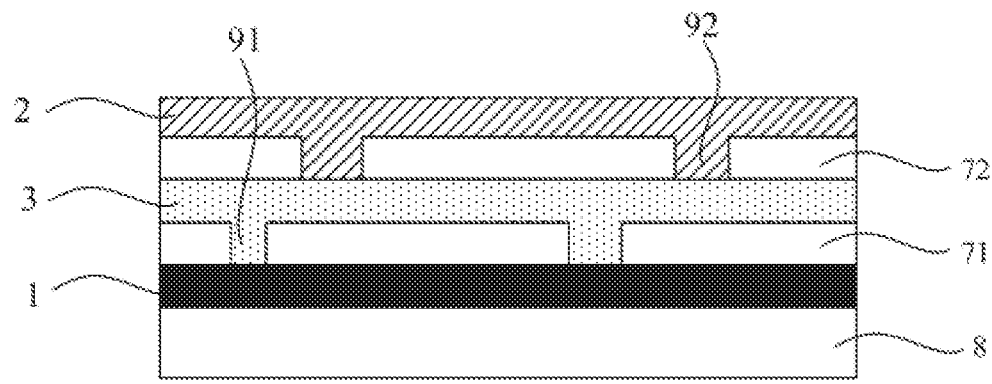
FIG. 3 shows a partial sectional structural view taken by cutting the touch substrate along line AA' as shown in FIG. 2.

As shown in FIGS. 2 and 3, the auxiliary conductive structure 3 is coupled to the corresponding signal line 1 at multiple coupling positions, which can reduce a resistance between the auxiliary conductive structure 3 and the corresponding signal line 1.

In some implementations, as shown in FIG. 2, among the multiple coupling positions between the auxiliary conductive structure 3 and the corresponding touch electrode 2, an orthographic projection of at least one of the multiple coupling positions on the base substrate 8 does not overlap an orthographic projection of the signal line 1 corresponding to the auxiliary conductive structure 3 on the base substrate 8.

It should be understood that, the signal line 1 and the touch electrode 2 may also overlap at multiple positions, thus the signal line 1 may also be coupled to the touch electrode 2 directly at multiple coupling positions. However, obviously, the signal line 1 only may be coupled to the corresponding touch electrode 2 at a position where the signal line 1 is located, thus the signal line 1 cannot transmit a signal to a position beyond a range where the signal line 1 is located. By contrast, the auxiliary conductive structure 3 may be provided beyond the range where the signal line 1 is located, thus can be coupled to the touch electrode 2 at a position beyond the range where the signal line 1 is located, thereby can transmit a signal to a position where the signal line 1 cannot reach.

Figure 4:
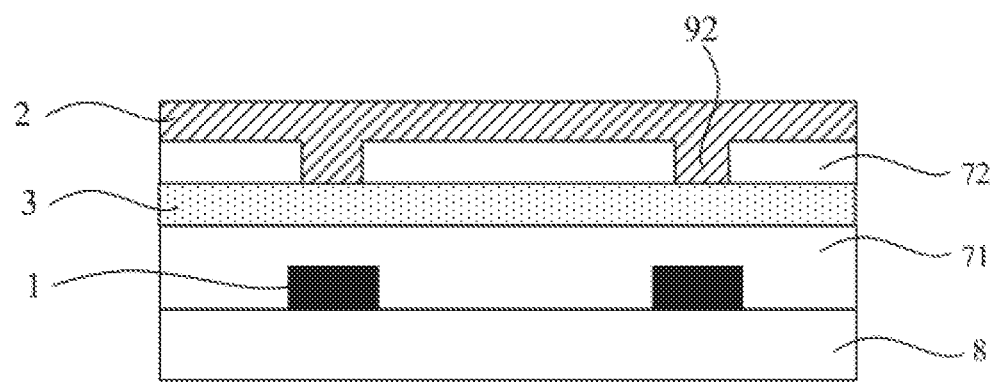
FIG. 4 shows a partial sectional structural view taken by cutting the touch substrate along line BB' as shown in FIG. 2.

In some implementations, at least one of the touch electrodes 2 not only overlaps the signal line 1 correspondingly coupled thereto, but also overlaps the signal line 1 not coupled thereto. That is to say, in the touch substrate of the embodiment, as shown in FIG. 2, at least one signal line 1 may extend to overlap multiple touch electrodes 2, but is coupled to only one of the touch electrodes 2 overlapped with it. Since signal lines 1 are generally formed in a same layer, obviously, different signal lines 1 cannot intersect with each other, if different signal lines 1 intersect with each other, the different signal lines 1 would communicate with each other, which is not desired, thus signal lines 1 may be provided in parallel, and in such case, the signal line 1 coupled to the corresponding touch electrode 2 cannot cross the signal line 1 not coupled to the same touch electrode 2 to be coupled to the touch electrode 2 at any position. In the touch substrate of the embodiment, as shown in FIG. 4, by providing the auxiliary conductive structure 3 and the first insulation layer 71 between the auxiliary conductive structure 3 and the signal line 1, the auxiliary conductive structure 3 may overlap any signal line 1 but does not communicate with it, thus the auxiliary conductive structure 3 can cross any signal line 1 to be coupled to the corresponding touch electrode 2 at any position, so as to transmit a signal to the touch electrode 2, which can improve uniformity of signal in the touch electrode 2.

In the present disclosure, the signal line 1 coupled to the corresponding touch electrode 2 may be referred to as "first signal line", and the signal line 1 overlapped with the touch electrode 2 but not coupled to the same touch electrode 2 may be referred to as "second signal line".

In some implementations, the auxiliary conductive structure 3 provided and coupled to the touch electrode 2 correspondingly may be of a net-like structure.

By providing the auxiliary conductive structure 3 as a net-like structure, not only a resistance of the auxiliary conductive structure 3 may be reduced, but also it facilitates the auxiliary conductive structure 3 to be coupled to the corresponding touch electrode 2 at any position, which may further improve uniformity of signal in the touch electrode 2.

It should be understood that, without departing from the concept of the present disclosure, the auxiliary conductive structure 3 may also be any other form.

In some implementations, a layer where the auxiliary conductive structure 3 is located is between a layer where the signal line 1 is located and a layer where the touch electrode 2 is located.

Since both the signal line 1 and the touch electrode 2 are coupled to the auxiliary conductive structure 3, and the auxiliary conductive structure 3 and the signal line 1 cannot be in a same layer, as shown in FIG. 3, the auxiliary conductive structure 3 may be provided between the signal line 1 and the touch electrode 2, to facilitate to be coupled to the signal line 1 and the touch electrode 2. FIG. 3 only shows a case where the signal line 1 is located at a side of the auxiliary conductive structure 3 proximal to the base substrate 8 and the touch electrode 2 is located at a side of the auxiliary conductive structure 3 distal to the base substrate 8, but in practical applications, the signal line 1 may also be located at a side of the auxiliary conductive structure 3 distal to the base substrate 8 and the touch electrode 2 may be located at a side of the auxiliary conductive structure 3 proximal to the base substrate 8.

In some implementations, a second insulation layer 72 may be provided between the auxiliary conductive structure 3 and the touch electrode 2, the auxiliary conductive structure 3 may be coupled to the touch electrode 2 at multiple coupling positions through multiple second via-holes 92 penetrating through the second insulation layer 72.

In practical applications, the auxiliary conductive structure 3 may directly contact the touch electrode 2, that is, the second insulation layer 72 may be not provided.

Figure 5:
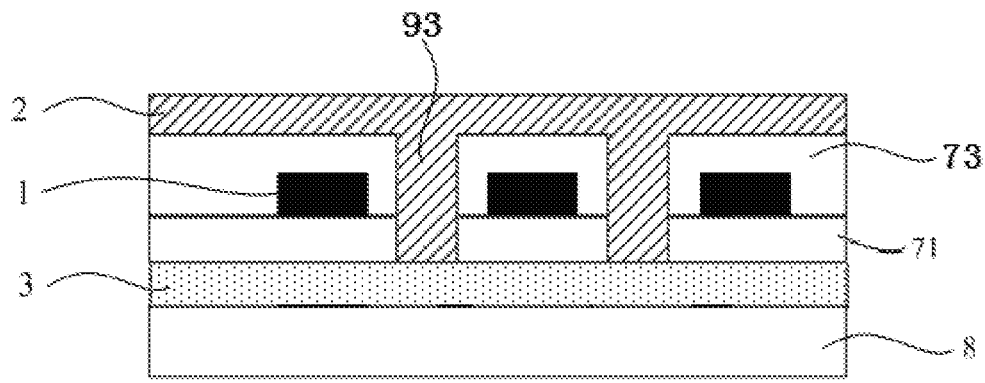
FIG. 5 shows another partial sectional structural view taken by cutting the touch substrate in an embodiment of the present disclosure.

In some implementations, as shown in FIG. 5, a layer where the signal line 1 is located is between a layer where the auxiliary conductive structure 3 is located and a layer where the touch electrode 2 is located, a third insulation layer 73 may be provided between the signal line 1 and the touch electrode 2, the auxiliary conductive structure 3 may be coupled to the touch electrode 2 at multiple coupling position, where there is no the signal line 1, through multiple third via-holes 93 penetrating through the first insulation layer 71 and the third insulation layer 73.

The touch substrate of the embodiment of the present disclosure may be for example a self-capacitive touch substrate.

Figure 6:
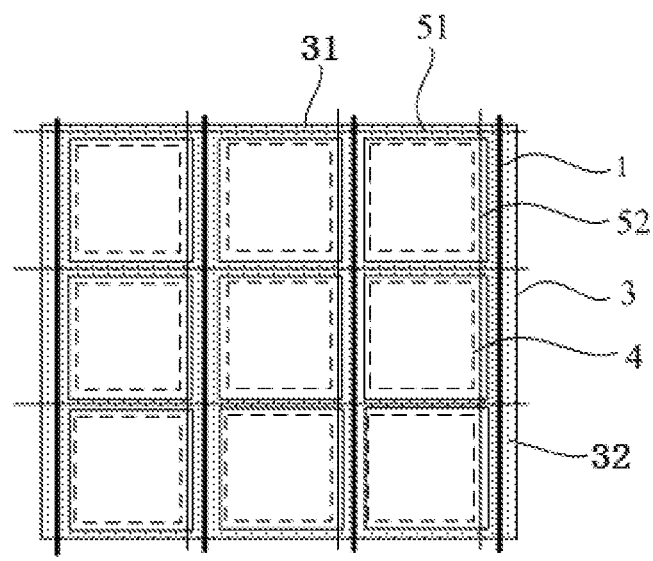
FIG. 6 shows a distribution diagram of pixel elements of a display substrate in an embodiment of the present disclosure.

FIG. 6 shows a distribution diagram of pixel elements of a display substrate in an embodiment of the present disclosure. As shown in FIG. 6, the display substrate of the embodiment includes pixel elements arranged at intervals and touch structures arranged at intervals, at least one of the touch structures covers multiple adjacent pixel elements, and at least one of the touch structures is the touch structure of the embodiment of the present disclosure, and the signal line 1 and the auxiliary conductive structure 3 may be provided in an interval between adjacent pixel elements.

In some implementations, each of the touch structures covers multiple adjacent pixel elements 4, and the signal line 1 and the auxiliary conductive structure 3 may be provided in an interval between adjacent pixel elements 4.

It should be understood that, the touch electrode 2 generally has a dimension in an order of millimeter, which is significantly greater than that of the pixel element, thus in practical applications, each touch electrode 2 generally covers multiple pixel elements 4. In such case, the signal line 1 and the auxiliary conductive structure 3 may be provided in an interval between adjacent pixel elements 4, where a black matrix is generally provided, the signal line 1 and the auxiliary conductive structure 3 being provided in the interval where the black matrix is generally provided will not affect display of the display substrate and reduce an aperture ratio of the display substrate.

In a case where the auxiliary conductive structure 3 is of a net-like structure, branches of the auxiliary conductive structure 3 may be provided in an interval between adjacent pixel elements.

In some implementations, the display substrate of the embodiment further includes a gate line 51 and a data line 52, the auxiliary conductive structure 3 and the gate line 51 are provided in different layers, the auxiliary conductive structure 3 and the data line 52 are provided in different layers, at least one insulation layer is provided between the auxiliary conductive structure 3 and the gate line 51, and at least one insulation layer is provided between the auxiliary conductive structure 3 and the data line 52.

It should be understood that, in a case where the auxiliary conductive structure 3 is coupled to the touch electrode 2 at any position, in order to avoid the auxiliary conductive structure 3 overlapping and communicating with the gate line 51 and/or the data line 52, at least one insulation layer is provided between the auxiliary conductive structure 3 and the gate line 51, and at least one insulation layer is provided between the auxiliary conductive structure 3 and the data line 52.

In some implementations, the signal line 1 and the data line 52 are provided in a same layer and in parallel.

In some implementations, the auxiliary conductive structure 3 includes: a first part 31 parallel to the gate line 51, the first part 31 may overlap the gate line 51; and a second part 32 parallel to the data line 52, and the second part 32 may overlap the signal line 1.

Since the signal line 1 and the data line 52 may be provided in a same layer, in order to avoid the signal line 1 and the data line 52 communicating with each other, the signal line 1 and the data line 52 may be provided in parallel.

However, as shown in FIG. 6, a portion (first part 31) of the auxiliary conductive structure 3 may overlap the gate line 51, and another portion (second part 32) of the auxiliary conductive structure 3 may overlap the signal line 1, which not only facilitates the auxiliary conductive structure 3 to be coupled to the corresponding signal line 1, but also will not affect an aperture ratio of the display substrate.

In some implementations, the display substrate of the embodiment may be an array substrate.

In some implementations, the touch electrode 2 may be multiplexed as a common electrode.

That is to say, at a display stage, the touch electrode 2 may be provided with a common voltage so that the touch electrode 2 functions as a common electrode for a display function, and at a touch stage, the touch electrode 2 may be provided with a touch control signal so that the touch electrode 2 functions as a touch electrode for a touch function.

An embodiment of the present disclosure further provides a method for manufacturing the touch structure of the embodiment of the present disclosure. The method may include: forming a first signal line and an auxiliary conductive structure on a base substrate, a first insulation layer is formed between the auxiliary conductive structure and the first signal line; and forming a touch electrode on the base substrate formed with the first signal line and the auxiliary conductive structure, the auxiliary conductive structure has a conductivity greater than that of the touch electrode, the auxiliary conductive structure is formed to be coupled to the touch electrode at multiple coupling positions, and coupled to the first signal line through a first via-hole formed in the first insulation layer.

In some implementations, the auxiliary conductive structure is formed to be coupled to the first signal line at multiple coupling positions through multiple first via-holes penetrating through the first insulation layer respectively.

In some implementations, the auxiliary conductive structure and the touch electrode are formed so that an orthographic projection of at least one of the multiple coupling positions between the auxiliary conductive structure and the touch electrode on the touch electrode does not overlap an orthographic projection of the first signal line on the touch electrode.

In some implementations, the method further includes: forming a second signal line in a same layer as the first signal line, the first signal line and the second signal line are in parallel, and the second signal line is not coupled to the touch electrode, the auxiliary conductive structure and the touch electrode are formed so that an orthographic projection of at least one of the multiple coupling positions between the auxiliary conductive structure and the touch electrode on the touch electrode is at a side of an orthographic projection of the second signal line on the touch electrode away from an orthographic projection of the first signal line on the touch electrode.

In some implementations, the auxiliary conductive structure is formed to be of a net-like structure.

In some implementations, forming the first signal line and the auxiliary conductive structure on the base substrate includes: forming the first signal line on the base substrate; forming the first insulation layer above the first signal line; and forming the auxiliary conductive layer on the first insulation layer.

In some implementations, forming the touch electrode on the base substrate formed with the first signal line and the auxiliary conductive structure includes: forming the touch electrode directly on the auxiliary conductive structure so that the auxiliary conductive structure directly contacts the touch electrode.

In some implementations, forming the touch electrode on the base substrate formed with the first signal line and the auxiliary conductive structure includes: forming a second insulation layer above the auxiliary conductive structure; and forming the touch electrode on the second insulation layer, and the auxiliary conductive structure is coupled to the touch electrode at multiple coupling positions through multiple second via-holes formed in the second insulation layer.

In some implementations, forming the first signal line and the auxiliary conductive structure on the base substrate includes: forming the auxiliary conductive structure on the base substrate; forming the first insulation layer above the auxiliary conductive structure; forming the first signal line on the first insulation layer; and forming a third insulation layer above the first signal line. Correspondingly, forming the touch electrode on the base substrate formed with the first signal line and the auxiliary conductive structure includes: forming the touch electrode on the third insulation layer, the auxiliary conductive structure is formed to be coupled to the touch electrode at multiple coupling positions through multiple third via-holes formed in the first insulation layer and the third insulation layer, and a position of the first signal line does not overlap positions of the third via-holes.

In the embodiment, processes for forming structures may include a patterning process and so on.

The method for manufacturing the touch structure of the embodiment of the present disclosure is described above by taking a case where the touch electrode is formed father from the base substrate than the signal line and the auxiliary conductive structure (i.e., the touch electrode is formed at a side of the signal line and the auxiliary conductive distal to the base substrate) as an example, however, in practical applications, the touch electrode may also be formed to directly contact the base substrate. That is to say, referring to FIGS. 3 through 5, the structures on the base substrate 8 may be entirely inversed, so that the touch electrode 2 is directly formed on the base substrate 8.

In addition, it should be noted that, the touch substrate of the embodiment of the present disclosure may be directly attached to a light exiting surface of a display panel, to achieve a display panel having a touch function.

The display panel may be a liquid crystal display panel, an organic light emitting diode display panel and so on.

An embodiment of the present disclosure further provides a display device including the touch substrate, the display substrate or the display panel of the embodiment of the present disclosure.

It should be understood that, the display device may further include other components.

The display device may be any product or member having a display function, such as electronic paper, mobile phone, tablet computer, television, display, notebook computer, digital photo frame, and navigator.

It should be understood that, the above embodiments are merely exemplary embodiments for explaining principle of the present disclosure, but the present disclosure is not limited thereto. Various modifications and improvements may be made by those ordinary skilled in the art within the spirit and essence of the present disclosure, these modifications and improvements fall into the protection scope of the present disclosure.

The invention claimed is:

1. A touch structure, comprising:
   a touch electrode;
   a first signal line and an auxiliary conductive structure provided at a side of the touch electrode, the auxiliary conductive structure has a conductivity greater than that of the touch electrode; and
   a first insulation layer provided between the auxiliary conductive structure and the first signal line, the auxiliary conductive structure is coupled to the touch electrode at multiple coupling positions and is coupled to the first signal line through a first via-hole penetrating through the first insulation layer,
   wherein a layer where the auxiliary conductive structure is located is between a layer where the first signal line is located and a layer where the touch electrode is located, and
   wherein a second insulation layer is provided between the auxiliary conductive structure and the touch electrode, the auxiliary conductive structure is coupled to the touch electrode at multiple coupling positions through multiple second via-holes penetrating through the second insulation layer.

2. The touch structure of claim 1, wherein the auxiliary conductive structure is coupled to the first signal line at multiple coupling positions through multiple first via-holes penetrating through the first insulation layer respectively.

3. The touch structure of claim 1, wherein an orthographic projection of at least one of the multiple coupling positions between the auxiliary conductive structure and the touch electrode on the touch electrode does not overlap an orthographic projection of the first signal line on the touch electrode.

4. The touch structure of claim 1, further comprising:
a second signal line provided in a same layer as the first signal line, the first signal line and the second signal line are provided in parallel, and the second signal line is not coupled to the touch electrode, an orthographic projection of at least one of the multiple coupling positions between the auxiliary conductive structure and the touch electrode on the touch electrode is at a side of an orthographic projection of the second signal line on the touch electrode away from an orthographic projection of the first signal line on the touch electrode.

5. The touch structure of claim 1, wherein the auxiliary conductive structure is of a net-like structure.

6. The touch structure of claim 2 wherein the auxiliary conductive structure directly contacts the touch electrode.

7. A touch substrate, comprising:
a base substrate;
a plurality of touch structures provided at intervals on the base substrate, the touch structures are arranged in an array, and at least one of the touch structures is the touch structure of claim 1.

8. A display substrate, comprising pixel elements provided at intervals and touch structures provided at intervals, at least one of the touch structures covers multiple adjacent pixel elements, at least one of the touch structures is the touch structure of claim 1, and the first signal line and the auxiliary conductive structure of the at least one of the touch structures are provided in an interval between adjacent pixel elements.

9. The display substrate of claim 8, further comprising a gate line and a data line, the auxiliary conductive structure and the gate line are provided in different layers, the auxiliary conductive structure and the data line are provided in different layers, at least one insulation layer is provided between the auxiliary conductive structure and the gate line, and at least one insulation layer is provided between the auxiliary conductive structure and the data line.

10. The display substrate of claim 9, wherein the first signal line and the data line are provided in a same layer and in parallel, and
the auxiliary conductive structure comprises a first part parallel to the gate line and a second part parallel to the data line, an orthographic projection of the first part of the auxiliary conductive structure on the touch electrode overlaps an orthographic projection of the gate line on the touch electrode, and orthographic projection of the second part of the auxiliary conductive structure on the touch electrode overlaps an orthographic projection of the first signal line on the touch electrode.

11. The display substrate of claim 8, wherein the touch electrode is multiplexed as a common electrode.

12. A touch structure, comprising:
a touch electrode;
a first signal line and an auxiliary conductive structure provided at a side of the touch electrode, the auxiliary conductive structure has a conductivity greater than that of the touch electrode; and
a first insulation layer provided between the auxiliary conductive structure and the first signal line, the auxiliary conductive structure is coupled to the touch electrode at multiple coupling positions and is coupled to the first signal line through a first via-hole penetrating through the first insulation layer,
wherein a layer where the first signal line is located is between a layer where the auxiliary conductive structure is located and a layer where the touch electrode is located, a third insulation layer is provided between the first signal line and the touch electrode, the auxiliary conductive structure is coupled to the touch electrode at multiple coupling positions through multiple third via-holes penetrating through the first insulation layer and the third insulation layer, and a position of the first signal line does not overlap positions of the third via-holes.

13. A method for manufacturing a touch structure, comprising:
forming a first signal line and an auxiliary conductive structure on a base substrate, a first insulation layer is formed between the auxiliary conductive structure and the first signal line; and
forming a touch electrode on the base substrate formed with the first signal line and the auxiliary conductive structure, the auxiliary conductive structure has a conductivity greater than that of the touch electrode, the auxiliary conductive structure is formed to be coupled to the touch electrode at multiple coupling positions, and coupled to the first signal line through a first via-hole formed in the first insulation layer,
wherein the method further comprises:
forming a second signal line in a same layer as the first signal line, the first signal line and the second signal line are in parallel, and the second signal line is not coupled to the touch electrode, the auxiliary conductive structure and the touch electrode are formed so that an orthographic projection of at least one of the multiple coupling positions between the auxiliary conductive structure and the touch electrode on the touch electrode is at a side of an orthographic projection of the second signal line on the touch electrode away from an orthographic projection of the first signal line on the touch electrode.

14. The method of claim 13, wherein forming the first signal line and the auxiliary conductive structure on the base substrate comprises:
forming the first signal line on the base substrate;
forming the first insulation layer above the first signal line; and
forming the auxiliary conductive layer on the first insulation layer.

15. The method of claim 14, wherein forming the touch electrode on the base substrate formed with the first signal line and the auxiliary conductive structure comprises:
forming the touch electrode directly on the auxiliary conductive structure so that the auxiliary conductive structure directly contacts the touch electrode.

16. The method of claim 14, wherein forming the touch electrode on the base substrate formed with the first signal line and the auxiliary conductive structure comprises:
forming a second insulation layer above the auxiliary conductive structure; and forming the touch electrode on the second insulation layer, and the auxiliary conductive structure is coupled to the touch electrode at multiple coupling positions through multiple second via-holes formed in the second insulation layer.

17. The method of claim 13, wherein forming the first signal line and the auxiliary conductive structure on the base substrate comprises:

forming the auxiliary conductive structure on the base substrate;

forming the first insulation layer above the auxiliary conductive structure;

forming the first signal line on the first insulation layer; and forming a third insulation layer above the first signal line, forming the touch electrode on the base substrate formed with the first signal line and the auxiliary conductive structure comprises:

forming the touch electrode on the third insulation layer, wherein the auxiliary conductive structure is formed to be coupled to the touch electrode at multiple coupling positions through multiple third via-holes formed in the first insulation layer and the third insulation layer, and a position of the first signal line does not overlap positions of the third via-holes.

* * * * *